(12) United States Patent
Koto

(10) Patent No.: US 12,289,101 B2
(45) Date of Patent: Apr. 29, 2025

(54) DUPLEXER

(71) Applicant: Sanan Japan Technology Corporation, Tokyo (JP)

(72) Inventor: Yuki Koto, Tokyo (JP)

(73) Assignee: Sanan Japan Technology Corporation, Tokyo (JP)

(*) Notice: Subject to any disclaimer, the term of this patent is extended or adjusted under 35 U.S.C. 154(b) by 364 days.

(21) Appl. No.: 17/817,236

(22) Filed: Aug. 3, 2022

(65) Prior Publication Data

US 2023/0047266 A1 Feb. 16, 2023

(30) Foreign Application Priority Data

Aug. 16, 2021 (JP) .................................. 2021-132392

(51) Int. Cl.
  *H03H 9/72* (2006.01)
  *H03H 9/25* (2006.01)
  *H03H 9/64* (2006.01)

(52) U.S. Cl.
  CPC .............. *H03H 9/725* (2013.01); *H03H 9/25* (2013.01); *H03H 9/6483* (2013.01)

(58) Field of Classification Search
  None
  See application file for complete search history.

(56) References Cited

U.S. PATENT DOCUMENTS

| | | | |
|---|---|---|---|
| 2014/0049341 A1* | 2/2014 | Komatsu | H03H 9/14588 333/187 |
| 2018/0123565 A1* | 5/2018 | Takamine | H03H 9/25 |
| 2020/0014365 A1* | 1/2020 | Nambu | H03H 9/725 |
| 2020/0036365 A1* | 1/2020 | Nosaka | H03H 9/6483 |
| 2022/0255533 A1* | 8/2022 | Tanaka | H03H 9/14558 |

FOREIGN PATENT DOCUMENTS

| | | |
|---|---|---|
| JP | 2010062873 A | 3/2010 |
| JP | 2020043404 A | 3/2020 |
| JP | 2020065158 A | 4/2020 |
| JP | 7075150 B1 | 5/2022 |
| WO | 2012032832 A1 | 3/2012 |
| WO | 2016013330 A1 | 1/2016 |

OTHER PUBLICATIONS

[English Translation] Decision to Grant a Patent dated Apr. 8, 2022 for Japanese Patent Application No. 2021-132392.
[English Translation] Notice of Reasons for Refusal dated Feb. 21, 2022 for Japanese Patent Application No. 2021-132392.
[English Translation] Written Opinion dated Mar. 29, 2022 for Japanese Patent Application No. 2021-132392.

* cited by examiner

*Primary Examiner* — Andrea Lindgren Baltzell
*Assistant Examiner* — Abigail Amir Yaldo
(74) *Attorney, Agent, or Firm* — Dorsey & Whitney LLP

(57) ABSTRACT

A duplexer includes a piezoelectric substrate, a receiving filter formed on the piezoelectric substrate, the receiving filter includes a plurality of resonators, and a transmitting filter formed on the piezoelectric substrate, the transmitting filter includes a plurality of resonators. One of the resonators of the receiving filter is a multi-mode type acoustic wave resonator having a capacitance that is two times or more the average capacitance of the other resonators formed on the piezoelectric substrate.

10 Claims, 5 Drawing Sheets

DUPLEXER

CROSS-REFERENCE TO RELATED APPLICATION(S)

This application claims priority to Japanese Application No. 2021-132392, filed Aug. 16, 2021, which are incorporated herein by reference, in their entirety, for any purpose.

BACKGROUND

Field

The present disclosure relates to a duplexer.

Background Art

Patent Document 1 (JP2020-43404) discloses an example of a technique relating to a duplexer. Recent technological developments have made mobile communication terminals as typified by smartphones remarkably miniaturized and lightened. As a duplexer used in such a mobile communication terminal, a duplexer which can be miniaturized is used. In addition, as a mobile communication system, simultaneous transmission and reception communication systems are rapidly increasing. The demand for duplexers is rapidly increasing.

Under the circumstances, a multi-mode type acoustic wave resonator having a balanced-unbalanced conversion function is used as a receiving filter of the duplexer. Further, the change of the mobile communication system makes required specifications of the duplexer stricter. Therefore, the multi-mode type acoustic wave resonator which is closer to the rectangle than the conventional resonator and has an excellent passband characteristic in steepness with low loss is required.

SUMMARY

However, even though the technique disclosed in Patent Document 1 is employed, it is impossible to provide a duplexer using a multi-mode resonator having sufficient passband characteristics. Some examples described herein may provide a duplexer using a multi-mode type acoustic wave resonator which is closer to rectangular, has low loss and excellent passband characteristics in steepness.

In some examples, a duplexer includes a piezoelectric substrate, a receiving filter formed on the piezoelectric substrate, the receiving filter includes a plurality of resonators, and a transmitting filter formed on the piezoelectric substrate, the transmitting filter includes a plurality of resonators, wherein one of the resonators of the receiving filter is a multi-mode type acoustic wave resonator having a capacitance that is two times or more the average capacitance of the other resonators formed on the piezoelectric substrate.

DETAILED DESCRIPTION

Figure 1:
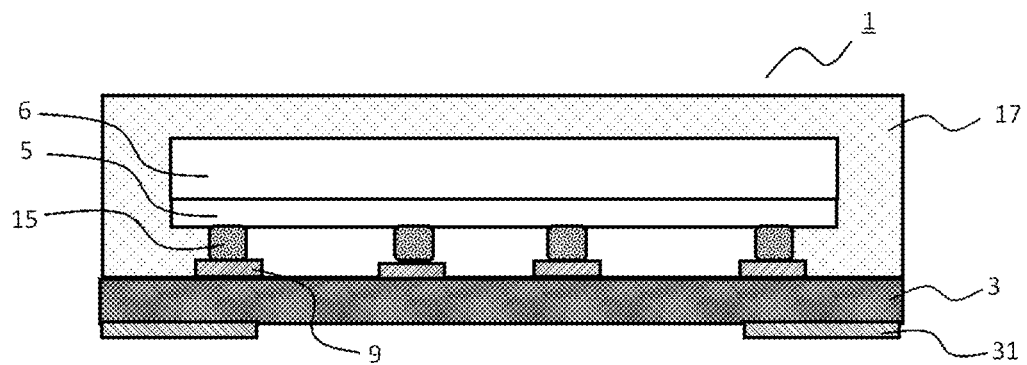
FIG. 1 is a cross-sectional view of a duplexer 1 in the embodiment 1.

The embodiments will be described with reference to the accompanying drawings. In the drawings, the same or corresponding parts are denoted by the same reference numerals. Duplicate descriptions of such portions may be simplified or omitted.

EMBODIMENT

Embodiment 1

FIG. 1 is a cross-sectional view of a duplexer 1 in the embodiment 1. According to the present the embodiment of the invention, the duplexer 1 has a wiring substrate 3 and a piezoelectric substrate 5 mounted on the wiring substrate 3 as shown in FIG. 1. For example, a multilayer substrate made of resin or a plurality of dielectric layers made of low-temperature co-fired ceramic (Low Temperature Co-Fired Ceramics: LTCC) is used for the wiring substrate 3. Further, the wiring substrate 3 has a plurality of external connection terminals 31.

A receiving filter comprising a plurality of resonators and a transmitting filter comprising a plurality of resonators are formed on the piezoelectric substrate 5. The receiving filter and the transmitting filter are band-pass filters configured so that electrical signals pass through the desired frequency band. The receiving filter and the transmitting filter are configured on one piezoelectric substrate 5 and to makes it possible to miniaturize the duplexer.

As the piezoelectric substrate 5, a substrate made of, for example, a piezoelectric single crystal such as lithium tantalate, lithium niobate, or quartz, or piezoelectric ceramics can be used. A support substrate 6 may be bonded to the piezoelectric substrate 5.

As the support substrate 6, for example, a sapphire substrate, an alumina substrate, a spinel substrate, or a silicon substrate can be used.

A plurality of electrode pads 9 are formed on the wiring substrate 3. As the electrode pad 9, for example, copper or an alloy containing copper can be used. The electrode pad 9 may for example have the thickness of 10 µm to 20 µm.

A sealing member 17 is formed to cover the piezoelectric substrate 5. The sealing member 17 may be made of, for example, an insulator such as a synthetic resin or a metal. As the synthetic resin, for example, an epoxy resin or a polyimide can be used but is not limited thereto. Preferably, an epoxy resin is used to form the seal 17 with a low temperature curing process.

The piezoelectric substrate 5 is mounted by flip-chip bonding on the wiring substrate 3 via a bump 15. As the bump 15, for example, a gold bump can be used. The height of the bump 15 is, for example, 20 μm to 50 μm. The electrode pad 9 is electrically connected to the piezoelectric substrate 5 via the bump 15.

Figure 2:
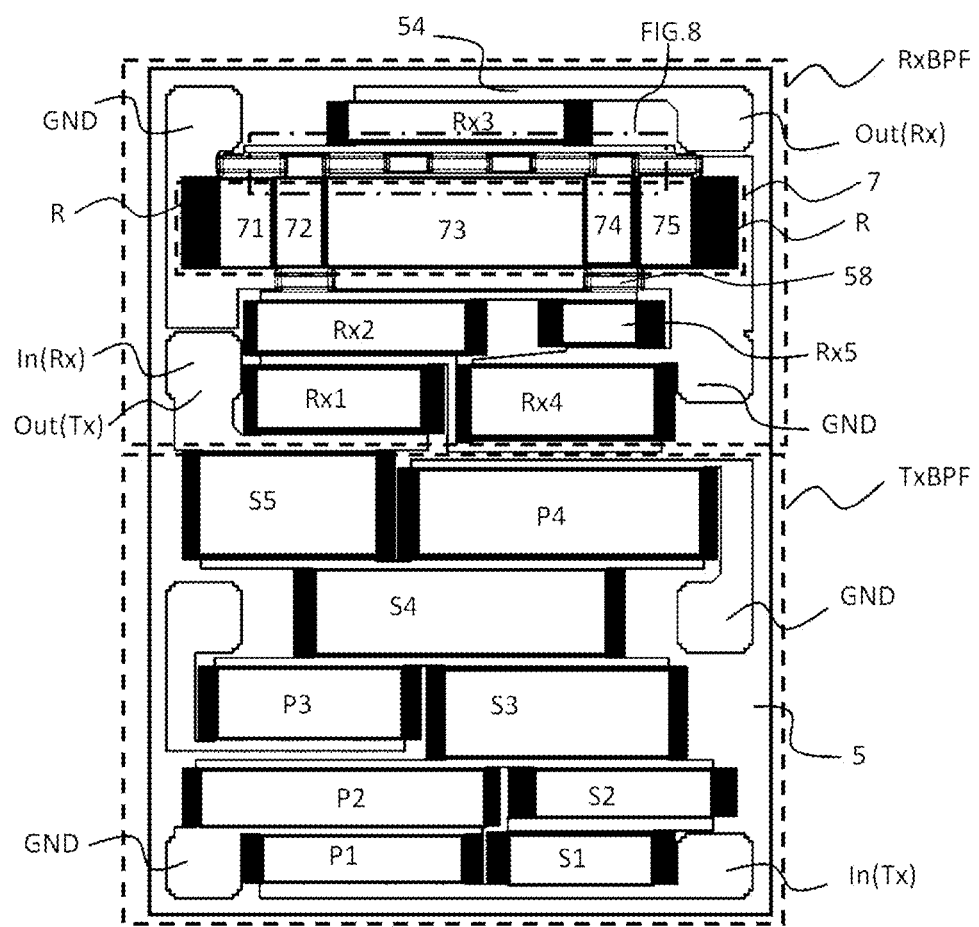
FIG. 2 shows the example of the configuration of the piezoelectric substrate 5 in the embodiment 1.

FIG. 2 shows the example of the configuration of the piezoelectric substrate 5 in the embodiment 1. As shown in FIG. 2, on one piezoelectric substrate 5, a receiving filter RxBPF comprising a plurality of resonators and a transmitting filter TxBPF comprising a plurality of resonators are formed. Therefore, it is possible to provide a duplexer as a duplexer in one piezoelectric substrate.

As shown in FIG. 2, the plurality of resonators constituting the receiving filter RxBPF comprise the resonators Rx1-Rx5 and the multi-mode type acoustic wave resonator 7. The plurality of resonators constituting the transmitting filter TxBPF comprises the resonators S1-S5 and the resonators P1-P5.

The capacitance of the resonator Rx1 is 4.34 pF, the capacitance of the resonator Rx2 is 4.18 pF, the capacitance of the resonator Rx3 is 3.23 pF, the capacitance of the resonator Rx4 is 5.25 pF, the capacitance of the resonator Rx5 is 1.13 pF, and the capacitance of the multi-mode type acoustic wave resonator 7 is 16.35 pF. The capacitance of the third IDT electrode 73 of the multi-mode type acoustic wave resonator 7 is 9.01 pF. The capacitance of the resonator S1 is 2.84 pF, the capacitance of the resonator S2 is 3.27 pF, the capacitance of the resonator S3 is 1.89 pF, the capacitance of the resonator S4 is 2.34 pF, the capacitance of the resonator S5 is 1.82 pF, the capacitance of the resonator P1 is 3.48 pF, the capacitance of the resonator P2 is 6.04 pF, the capacitance of the resonator P3 is 5.19 pF, and the capacitance of the resonator P4 is 2.36 pF.

The capacitance of the multi-mode type acoustic wave resonator 7 is two times or more than the average capacitance 3.38 pF of the other resonators. The capacitance of the third IDT electrode 73 is two times or more than the average capacitance of the other resonator. This improves impedance matching and can provide a duplexer with low loss. In addition, a duplexer including a receiving filter having excellent passband characteristics in steepness especially in high frequency side can be provided.

The capacitance of the multi-mode type acoustic wave resonator 7 is three times or more than that of the average capacitance 3.63 pF of the other resonators of the receiving filter. The capacitance of the third IDT electrode 73 is two times or more than the average capacitance of the other resonator of the receiving filter. This improves impedance matching and can provide a duplexer with low loss. In addition, a duplexer including a receiving filter having excellent passband characteristics in steepness especially in high frequency side can be provided.

As shown in FIG. 2, an input pad In (Rx) of the receiving filter RxBPF and an output pad Out (Tx) of the transmitting filter TxBPF are common pads. The output pad Out (Rx) of the receiving filter RxBPF is preferably formed on the position farthest from the input pad In (Tx) of the transmitting filter TxBPF on the piezoelectric substrate 5. This is because the interference between the receiving filter RxBPF and the transmitting filter TxBPF can be reduced and the characteristics of the duplexer is improved.

Further, it is desirable that the receiving filter RxBPF is a multi-mode type filter in order to ensure the suppression of outside of the passband with space-saving and the transmitting filter TxBPF is a ladder-type filter in order to ensure power durability in designing the receiving filter RxBPF and the transmitting filter TxBPF on one piezoelectric substrate 5.

Furthermore, it is desirable the area of the transmitting filter TxBPF is sufficient in order to ensure power durability on the piezoelectric substrate 5. That is, the area occupied on the piezoelectric substrate 5 of the region where the receiving filter RxBPF is formed is preferably smaller than the area occupied on the piezoelectric substrate 5 of the region where the transmitting filter TxBPF is formed.

The receiving filter RxBPF includes a multi-mode type acoustic wave resonator 7. The multi-mode type acoustic wave resonator 7 comprises a first IDT electrode 71, a second IDT electrode 72, a third IDT electrode 73, a fourth IDT electrode 74 and a fifth IDT electrode 75 adjacently formed in this order. Reflectors R are respectively and adjacently disposed to the first IDT electrode 71 and the fifth IDT electrode 75.

In the present embodiment, the number of the pair of electrode fingers of the first IDT electrode 71 is 22. The number of the pair of electrode fingers of the second IDT electrode 72 is 18. The third IDT electrode 73 has the number of the pair of electrode fingers of 96.5. The fourth IDT electrode 74 has the number of the pair of electrode fingers of 18. The fifth IDT electrode 75 has the number of the pair of electrode fingers of 22. That is, the number of the pair of electrode fingers of the third IDT electrode 73 is more than the sum of the number of the pair of electrode fingers of the first IDT electrode 71, the second IDT electrode 72, the fourth IDT electrode 74, and the fifth IDT electrode 75.

The number of the pair of electrode fingers of the first IDT electrode 71 and the number of the pair of electrode fingers of the fifth IDT electrode 75 are equal to 18. The number of the pair of electrode fingers of the second IDT electrode 72 and the number of the pair of electrode fingers of the fourth IDT electrode 74 are equal to 22.

A plurality of wiring patterns 54 are formed on the piezoelectric substrate 5. The wiring patterns 54 are electrically connected to each resonator. The wiring patterns 54 include the wiring constituting the input pad In, the output pad Out and the ground pad GND.

The wiring patterns 54 include a first metal layer and a second metal layer (not shown in FIG. 2). An insulator (not shown in FIG. 2) is disposed between the first metal layer and the second metal layer. As the insulator, for example, polyimide can be used. The thickness of the insulator, is formed by, for example, 1000 nm.

The wiring patterns 54 include a three-dimensional wiring part 58 which is wired so that the first metal layer and the second metal layer three-dimensionally intersect through the insulator.

The resonators and the wiring patterns 54 may be formed of any suitable metal or alloy such as silver, aluminum, copper, titanium, palladium, or the like. These metal patterns may be formed by a laminated metal film configured by laminating a plurality of metal layers. The thickness of the resonators and the wiring patterns 54 may be, for example, 150 nm to 400 nm.

The electrical signal input from the input pad In (Rx) passes through the receiving filter RxBPF, the electrical signal of the desired frequency band is output to the output pad Out (Rx). The electrical signal output to the output pad Out (Rx) is output from the external connection terminal 31 of the wiring substrate 3 via the bump 15 and the electrode pad 9.

The electrical signal input from the input pad In (Tx) passes through the transmitting filter TxBPF, the electrical signal of the desired frequency band is output to the output pad Out (Tx). The electrical signal output to the output pad Out (Tx) is output from the external connection terminal 31 of the wiring substrate 3 via the bump 15 and the electrode pad 9.

Figure 3:
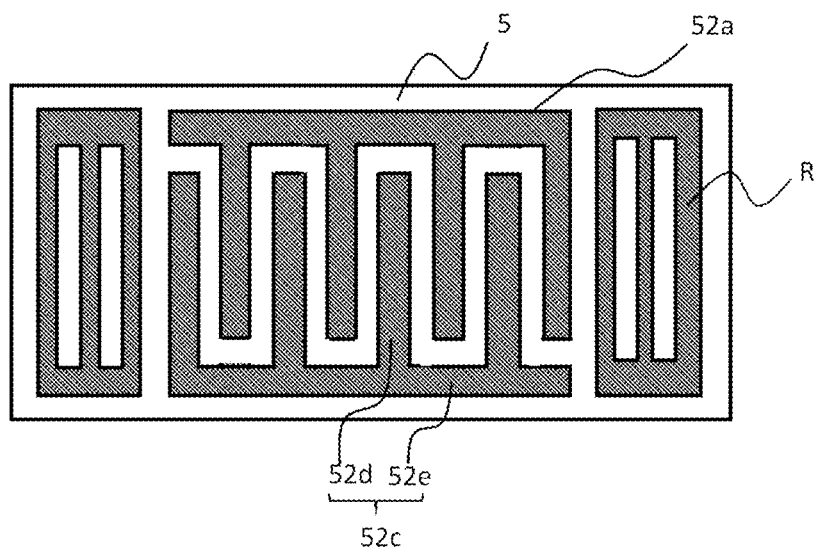
FIG. 3 shows the example of the configuration of the resonator.

FIG. 3 shows the example of the configuration of the resonator. As shown in FIG. 3, the IDT (Interdigital Transducer) 52a exciting the surface acoustic wave and the reflectors R are formed on the piezoelectric substrate 5. The IDT 52a has a pair of interdigitated comb-shaped electrodes 52c facing each other. The comb-shaped electrode 52c has a plurality of electrode fingers 52d and a bus bar 52e connecting the plurality of electrode fingers 52d. The reflectors R are disposed on both sides of the IDT 52a.

The IDT 52a and the reflectors R may be formed of, for example, alloys of aluminum and copper. The IDT 52a and the reflectors R are thin films having the thickness of, for example, 150 nm to 400 nm. The IDT 52a and the reflectors R may comprise or be formed of other metals, for example, any suitable metals such as titanium, palladium, silver, etc., or alloys thereof. The IDT 52a and the reflectors R may be formed of a laminated metal film configured by laminating a plurality of metal layers.

Figure 4:
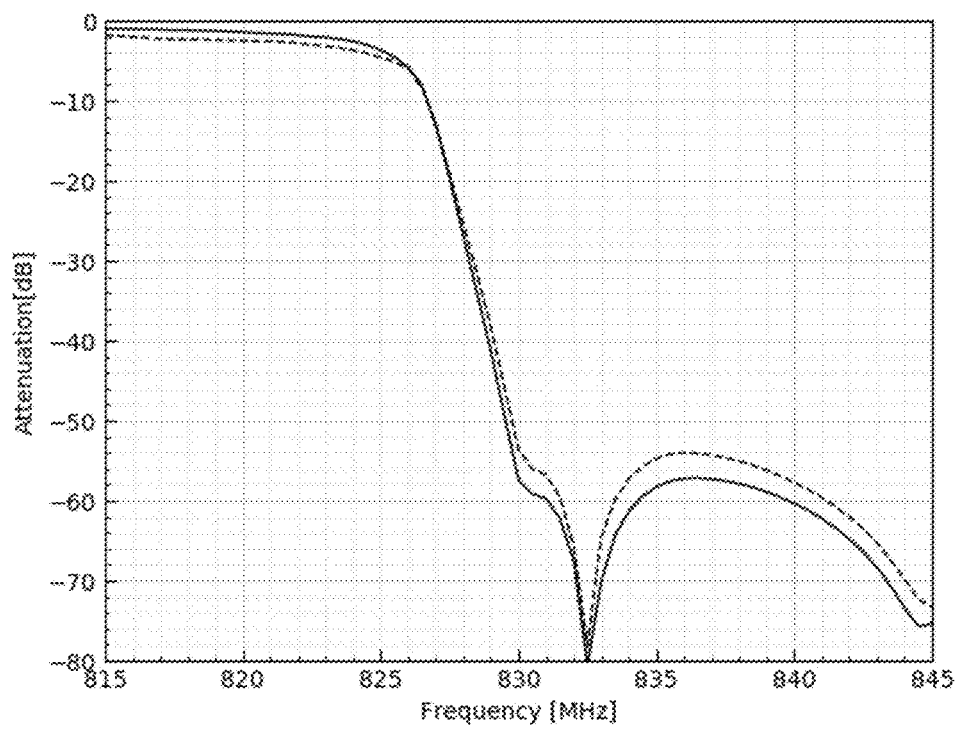
FIG. 4 is a chart showing the passband characteristics of the receiving filter RxBPF of the duplexer 1 in the embodiment 1 and the receiving filter of the duplexer as an example to be compared.

FIG. 4 is a chart showing the passband characteristics of the receiving filter RxBPF of the duplexer 1 in the embodiment 1 and the receiving filter of the duplexer as an example to be compared.

The waveform indicated by the solid line shows the passband characteristics of the receiving filter RxBPF of the duplexer 1 in the embodiment 1. The waveform indicated by the broken line shows the passband characteristic of the receiving filter of the duplexer as an example to be compared. The multi-mode resonator of the receiving filter of the duplexer as an example to be compared and the multi-mode resonator of the receiving filter of the duplexer 1 in the embodiment 1 (the aperture length is 31.56λ) have the same number of the pair of electrode fingers of the first to fifth IDT electrodes 71-75. And the aperture length and the capacitance of the multi-mode resonator of the receiving filter of the duplexer as an example to be compared are 18.94λ and 9.81 pF respectively. The other conditions of the multi-mode resonator of the receiving filter of the duplexer as an example to be compared are the same as those of the receiving filter of the duplexer 1 in the embodiment 1.

As shown in FIG. 4, it can be seen that the passband characteristic of the embodiment 1 is superior to that of the comparative example and has low loss. Besides, the region in which the frequency is higher than that in the vicinity of 820 MHz which is outside the pass band, and it is shown that the attenuation characteristic of the embodiment 1 is superior to that of the comparative example.

Figure 5:
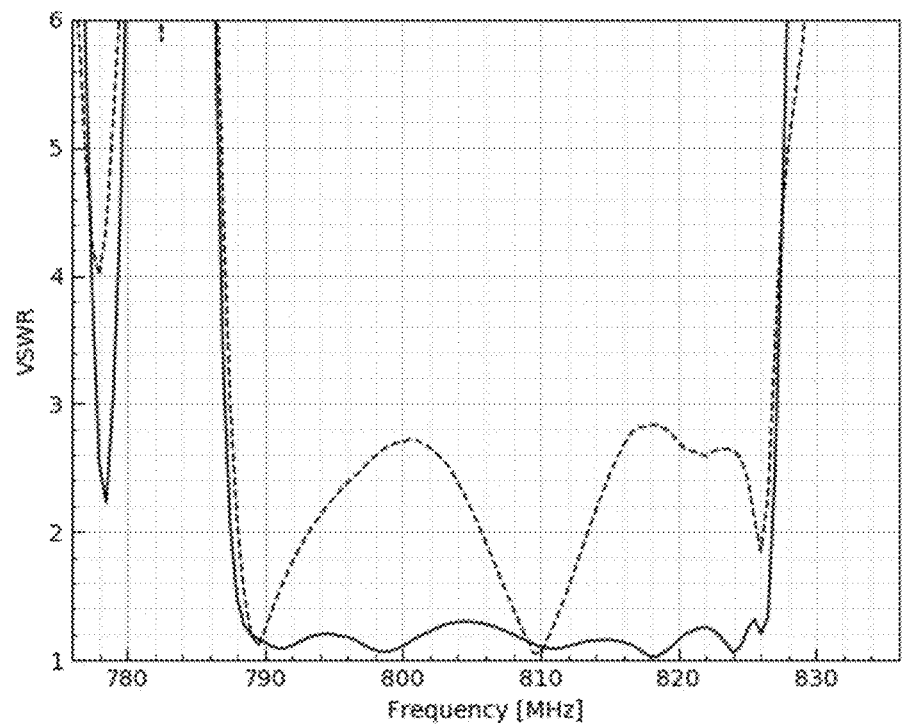
FIG. 5 is a chart showing the passband VSWR (Voltage Standing Wave Ratio) characteristics of the receiving filter RxBPF of the duplexer 1 in the embodiment 1 and the receiving filter of the duplexer as an example to be compared.

FIG. 5 is a chart showing the passband VSWR (Voltage Standing Wave Ratio) characteristics of the receiving filter RxBPF of the duplexer 1 in the embodiment 1 and the receiving filter of the duplexer as an example to be compared.

The waveform indicated by the solid line shows VSWR characteristics of the receiving filter RxBPF of the duplexer 1 in the embodiment 1. The waveform indicated by the broken line shows VSWR characteristics of the receiving filter of the duplexer as an example to be compared.

As shown in FIG. 5, it can be seen that the VSWR characteristics of the passband of the receiving filter RxBPF of the duplexer 1 in the embodiment 1 is superior to the VSWR characteristics of the receiving filter of the duplexer as an example to be compared and has low losses.

Figure 6:
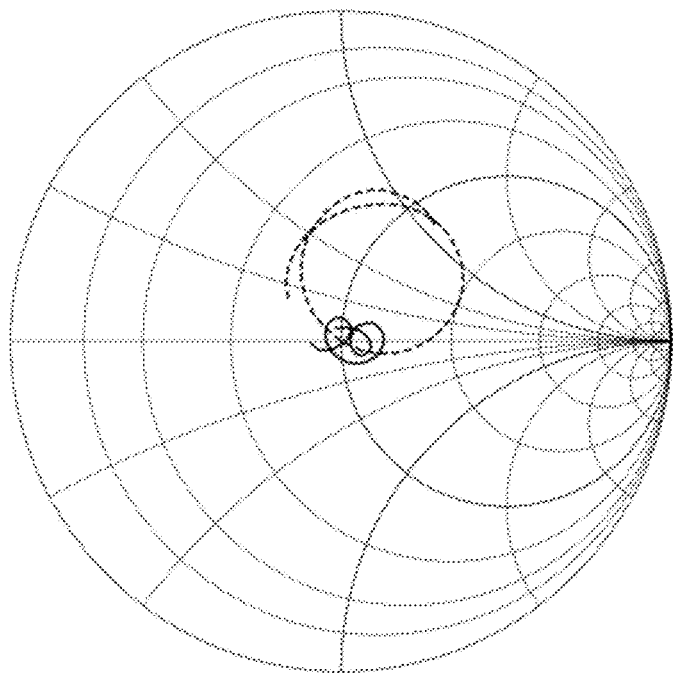
FIG. 6 is a Smith chart showing the complex impedance as viewed from the input pads of the receiving filter RxBPF of the duplexer 1 in the embodiment 1 and the receiving filter of the duplexer as an example to be compared.

FIG. 6 is a Smith chart showing the complex impedance as viewed from the input pads of the receiving filter RxBPF of the duplexer 1 in the embodiment 1 and the receiving filter of the duplexer as an example to be compared.

The waveform indicated by the solid line shows the impedance characteristic of the receiving filter RxBPF of the duplexer 1 in the embodiment 1.

The waveform indicated by the broken line shows the impedance characteristic of the receiving filter of the duplexer as an example to be compared.

As shown in FIG. 6, it can be seen that the impedance characteristics of the receiving filter RxBPF of the duplexer 1 in the embodiment 1 is superior to the impedance characteristic of the receiving filter of the duplexer as an example to be compared in impedance matching.

Figure 7:
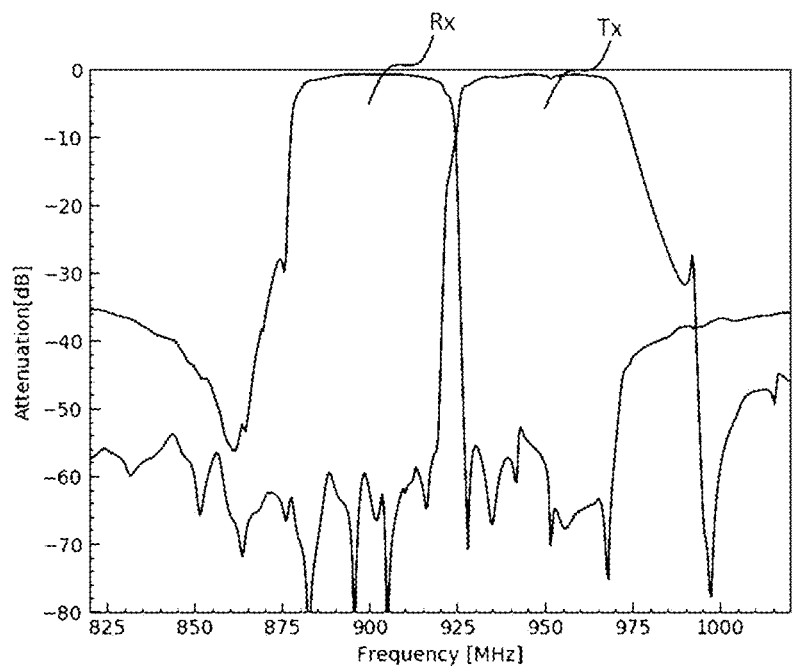
FIG. 7 is a chart showing the passband characteristic of the duplexer 1 in the embodiment 1.

FIG. 7 is a chart showing the passband characteristics of the duplexer 1 in the embodiment 1.

As shown in FIG. 7, the frequency of the passband Rx of the receiving filter RxBPF is lower than the frequency of the passband Tx of the transmitting filter TxBPF on the duplexer 1 in the embodiment 1.

On the duplexer in such a frequency relation, the receiving filter requires the steep suppression on the high frequency side of the passband of the receiving filter.

In general, it is difficult for the multi-mode filter to steep suppression of the high frequency side of the passband. However, the present disclosure enables to obtain excellent passband characteristics of both the passband of the receiving filter and the passband of the transmitting filter even on the duplexer having such a frequency relation.

Figure 8:
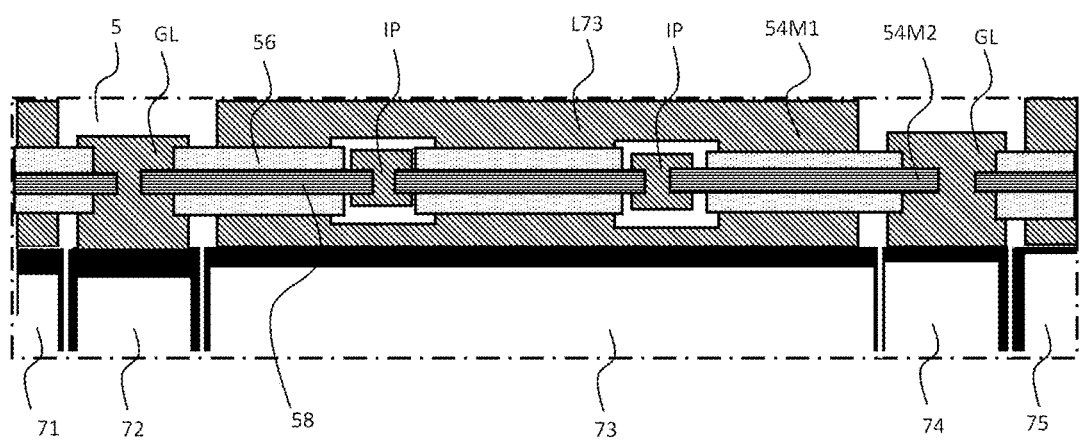
FIG. 8 is a diagram showing configuration of a region surrounded by a dashed line in FIG. 2.

FIG. 8 is a diagram showing the configuration of the region surrounded by the dashed line in FIG. 2.

As shown in FIG. 8, a first metal layer 54M1 is formed on the piezoelectric substrate 5. Further, the first metal layer 54M1 includes an island pattern IP and a signal line L73 of the third IDT electrode 73. The island pattern IP is insulated and surrounded by the signal line L73 of the third IDT electrode 73.

A ground line GL is formed on the piezoelectric substrate 5. The ground line GL is electrically connected with the second IDT electrode 72. The other ground line GL is electrically connected with the fourth IDT electrode 74 is also formed.

In addition, a second metal layer 54M2 electrically connecting the ground line GL and the island pattern IP is formed. Further, an insulator 56 is formed between the second metal layer 54M2 and the signal line L73.

Thus, the signal line L73, the insulator 56 and the second metal layer 54M2 constitute the three-dimensional wiring part 58 which is wired three-dimensionally.

According to the embodiment of the present disclosure, there has been a problem that the insulator 56 is peeled off due to the width of the third IDT electrode 73 is large. Therefore, the inventor has solved the problem that the insulator 56 is peeled off, by dividing the three-dimensional wiring part 58 and performing the three-dimensional wiring over the third IDT electrode 73 by a plurality of the three-dimensional wiring parts.

In addition, as shown in FIG. 8, three three-dimensional wiring parts 58 may be formed by forming two island patterns IP or two three-dimensional wiring parts 58 may be formed by forming one island pattern IP. When one island pattern IP is formed, the island pattern IP may be lengthened as necessary.

Here, the characteristics of the bandpass filter may be affected by the parasitic capacitance of the three-dimensional wiring parts 58 occurred between the signal line L73 and the second metal layer 54M2 as the ground line GL depending on the thickness and the area of the insulator 56. As the thickness of the insulator 56 is increased, the parasitic capacitance becomes less, while the insulator 56 is easier to be peeled off. Other hand, the larger the area of the insulator 56 is, the harder it is to be peel off, but the parasitic capacitance becomes larger.

In addition, it may be considered that the parasitic capacitance can be reduced when the island pattern IP is long, but the wiring pattern 54 of the signal line L73 become narrow and the resistance value increase when the island pattern IP is too long.

In the configuration of the present disclosure, it is possible to optimize the design while preventing peeling of the insulator 56 and deteriorating the characteristics due to parasitic capacitance. According to the configuration of the present disclosure, a duplexer having high flexibility of design and excellent characteristics can be provided.

Embodiment 2

Figure 9:
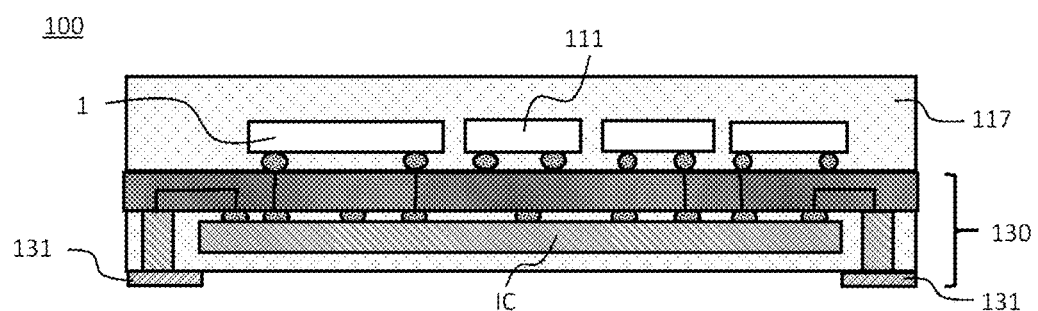
FIG. 9 is a cross-sectional view of a module 100 in the embodiment 2.

FIG. 9 is a cross-sectional view of a module 100 in the embodiment 2.

As shown in FIG. 9, the duplexer 1 is mounted on a main surface of a wiring board 130. The duplexer 1 is a duplexer employing the configuration described in the embodiment 1. The wiring board 130 includes a plurality of external connection terminals 131. The plurality of external connection terminals 131 are mounted on the motherboard of a predetermined mobile communication terminal.

An inductor 111 is mounted on the main surface of the wiring board 130 for impedance matching. The inductor 111 may be an Integrated Passive Device (IPD). The module 100 is sealed by a sealing member 117 sealing a plurality of electronic components including the duplexer 1.

An integrated circuit component IC is mounted inside the wiring board 130. The integrated circuit component IC, although not shown, includes a switching circuit and a low-noise amplifier.

Other configurations are the same as those described in the embodiment 1, and therefore description thereof is omitted.

According to the embodiments of the present disclosure described above, it is possible to provide a duplexer using a multi-mode type acoustic wave resonator which is closer to rectangular, has low loss and excellent passband characteristics in steepness and a module comprising the duplexer.

It should be noted that, of course, the present disclosure is not limited to the embodiments described above, but includes all the embodiments that can achieve the purpose of the present disclosure.

While several aspects of at least one the embodiment have been described, it is to be understood that various modifications and improvements will readily occur to those skilled in the art. Such modifications and improvements are intended to be part of the present disclosure and are intended to be within the scope of the present disclosure. It is to be understood that the embodiments of the methods and apparatus described herein are not limited in application to the structural and ordering details of the components set forth in the foregoing description or illustrated in the accompanying drawings. Methods and apparatus may be implemented in other embodiments or implemented in various manners. Specific implementations are given here for illustrative purposes only and are not intended to be limiting. The phraseology and terminology used in the present disclosure are for the purpose of description and should not be regarded as limiting. The use of "including," "comprising," "having," and variations thereof herein means the inclusion of the items listed hereinafter and equivalents thereof, as well as additional items. The reference to "or" may be construed so that any term described using "or" may be indicative of one, more than one, and all of the terms of that description. References to front, back, left, right, top, bottom, and side are intended for convenience of description. Such references are not intended to limit the components of the present disclosure to any one positional or spatial orientation. Accordingly, the foregoing description and drawings are by way of example only.

The invention claimed is:

1. A duplexer, comprising:
a piezoelectric substrate;
a receiving filter formed on the piezoelectric substrate, the receiving filter includes a first plurality of resonators; and
a transmitting filter formed on the piezoelectric substrate, the transmitting filter includes a second plurality of resonators;
wherein one of the first plurality of resonators of the receiving filter is a multi-mode type acoustic wave resonator having a capacitance that is two times or more an average capacitance of other ones of the first plurality of resonators and the second plurality of resonators formed on the piezoelectric substrate, and
wherein the multi-mode type acoustic wave resonator includes a first IDT electrode, a second IDT electrode, a third IDT electrode, a fourth IDT electrode and a fifth IDT electrode adjacently formed in this order, and a number of electrode fingers of the third IDT electrode is more than a sum of numbers of electrode fingers of the first IDT electrode, the second IDT electrode, the fourth IDT electrode, and the fifth IDT electrode.

2. The duplexer according to claim 1, wherein a frequency of a first passband of the receiving filter is lower than a frequency of a second passband of the transmitting filter.

3. The duplexer according to claim 1, wherein the multi-mode type acoustic wave resonator has a capacitance that is three times or more the average capacitance of the other ones of the first plurality of resonators of the receiving filter.

4. The duplexer according to claim 1, wherein a number of electrode fingers of the first IDT electrode is equivalent to a number of electrode fingers of the fifth IDT electrode.

5. The duplexer according to claim 1, wherein a number of electrode fingers of the second IDT electrode is equivalent to a number of electrode fingers of the fourth IDT electrode.

6. The duplexer according to claim 1, wherein,
a wiring pattern electrically connected to the multi-mode type acoustic wave resonator includes a first metal layer, a second metal layer formed on the first metal layer and an insulator formed between the first metal layer and the second metal layer,
the first metal layer includes an island pattern which is surrounded and insulated by a signal line of the third IDT electrode, and
the island pattern is electrically connected to a ground line of the second IDT electrode and the fourth IDT electrode via the second metal layer.

7. The duplexer according to claim 1, wherein a substrate made of sapphire, silicon, alumina, spinel, quartz, or glass is bonded to a main surface of the piezoelectric substrate opposite to a surface on which the receiving filter and the transmitting filter are formed.

8. The duplexer according to claim 1, wherein the second plurality of resonators of the transmitting filter is arranged in a ladder type.

9. The duplexer according to claim 1, wherein an area occupied on the piezoelectric substrate of the region where the receiving filter is formed is smaller than the area occupied on the piezoelectric substrate of the region where the transmitting filter is formed.

10. A module comprising the duplexer of claim 1.

* * * * *